United States Patent
Katoh et al.

(10) Patent No.: US 11,005,028 B2
(45) Date of Patent: May 11, 2021

(54) PIEZOELECTRIC COMPOSITION AND PIEZOELECTRIC ELEMENT

(71) Applicant: TDK CORPORATION, Tokyo (JP)

(72) Inventors: Hiroki Katoh, Tokyo (JP); Yuiko Hirose, Tokyo (JP); Masakazu Hirose, Tokyo (JP); Mirai Ishida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 182 days.

(21) Appl. No.: 16/357,864

(22) Filed: Mar. 19, 2019

(65) Prior Publication Data

US 2019/0288181 A1    Sep. 19, 2019

(30) Foreign Application Priority Data

Mar. 19, 2018 (JP) .............. JP2018-051589
Jan. 10, 2019 (JP) .............. JP2019-002836

(51) Int. Cl.
| | | |
|---|---|---|
| *H01L 41/187* | (2006.01) | |
| *H01L 41/43* | (2013.01) | |
| *C04B 35/495* | (2006.01) | |
| *C04B 35/63* | (2006.01) | |

(52) U.S. Cl.
CPC ........ *H01L 41/1873* (2013.01); *C04B 35/495* (2013.01); *C04B 35/6303* (2013.01); *H01L 41/43* (2013.01); *C04B 2235/3201* (2013.01); *C04B 2235/3255* (2013.01); *C04B 2235/407* (2013.01); *C04B 2235/768* (2013.01); *C04B 2235/85* (2013.01)

(58) Field of Classification Search
CPC .............. H01L 41/1873; C04B 35/495
See application file for complete search history.

(56) References Cited

U.S. PATENT DOCUMENTS

| 2004/0127344 A1 | 7/2004 | Sato et al. |
| 2006/0006360 A1 | 1/2006 | Takao et al. |

FOREIGN PATENT DOCUMENTS

| DE | 102006015042 | * 10/2007 |
| DE | 102006015042 A1 | 10/2007 |
| JP | 4398635 B2 | 1/2010 |

OTHER PUBLICATIONS

Kepi Chen et al. "Effects of GeO2 Addition on Sintering and Properties of (K0.5Na0.5)NbO3 Ceramics". Journal of the American Ceramic Society, Mar. 2016, pp. 1-6.

* cited by examiner

*Primary Examiner* — C Melissa Koslow
(74) *Attorney, Agent, or Firm* — Oliff PLC (57) ABSTRACT

A piezoelectric composition including copper, germanium and a complex oxide represented by a compositional formula $K_m NbO_3$ and having a perovskite structure, in which m in the compositional formula satisfies $0.970 \leq m \leq 0.999$, and with respect to 1 mol of the complex oxide, x mol % of copper in terms of a copper element and y mol % of germanium in terms of a germanium element are contained, wherein x satisfies $0.100 \leq x \leq 1.000$ and y satisfies $0.000 < y \leq 1.500$.

10 Claims, 4 Drawing Sheets

PIEZOELECTRIC COMPOSITION AND PIEZOELECTRIC ELEMENT

BACKGROUND OF THE INVENTION

The present invention relates to a piezoelectric composition and a piezoelectric element having thereof.

The piezoelectric composition has, based on a spontaneous polarization due to bias of an electric charge in crystals, an effect (a piezoelectric effect) of generating electric charge on the surface due to receiving an external stress and an effect (a converse piezoelectric effect) of generating distortion due to an application of an external electric field.

Piezoelectric elements to which such piezoelectric compositions, capable of mutually converting mechanical energy and electrical energy, are applied are widely used in various fields. For example, an actuator as the piezoelectric element utilizing the converse piezoelectric effect, in relative to an applied voltage, can provide a minute displacement with a high precision and has a fast response speed. Therefore, the actuator can be used as e.g. a driving element for an optical system component, an HDD head driving element, an ink jet printer head driving element, and a fuel injection valve driving element.

It is also used as a sensor for reading a minute force or deformation amount using the piezoelectric effect. Furthermore, since the piezoelectric composition has an excellent responsiveness, resonance can also be caused by exciting the piezoelectric composition itself or an elastic body that is connected with the piezoelectric composition by applying an AC electric field. Therefore, it is also used as a piezoelectric transformer, an ultrasonic motor, etc.

In general, the piezoelectric composition is composed of a polycrystalline substance and is obtained by subjecting a poling processing to the fired ferroelectric composition. In the ferroelectric composition after firing, the direction of spontaneous polarization in each crystal is random. And the ferroelectric composition as a whole has no bias of the electric charge and does not exhibit the piezoelectric effect or the converse piezoelectric effect. Therefore, by applying a DC electric field higher than the coercive electric field to the fired ferroelectric composition, an operation called poling processing in which the direction of spontaneous polarization is aligned in a certain direction is performed. The ferroelectric composition after the poling processing can exhibit properties as the piezoelectric composition.

As the piezoelectric composition, a lead based piezoelectric composition composed of lead zirconate ($PbZrO_3$) and lead titanate ($PbTiO_3$) is frequently used. However, the lead-based piezoelectric composition contains about 60 to 70 wt % of lead oxide (PbO) having a low melting point, and lead oxide easily volatilizes during firing. Therefore, from a viewpoint of environmental burden, development of a lead-free piezoelectric composition is an extremely important task.

Such as a bismuth layer structured material is known as the lead-free piezoelectric composition. However, since the bismuth layered ferroelectric has a large crystal anisotropy, it is necessary to orient the spontaneous polarization by utilizing a shearing stress applied by a hot forging method, which has a problem in terms of productivity.

On the other hand, a research on an alkali metal niobate based compound has recently progressed as a new eco-friendly piezoelectric composition. In order to provide new properties to the alkali metal niobate based compound, an additive component is added. For example, the following Patent Document 1 discloses a piezoelectric composition in which a copper oxide is added to the alkali metal niobate based compound. In addition, the following Non-Patent Document 1 discloses a piezoelectric composition in which a germanium oxide is added to the alkali metal niobate based compound.

Patent Document 1: JP Patent No. 4398635
Non-Patent Document 1: K. Chen, et al, "Effects of $GeO_2$ Addition on Sintering and Properties of $(K_{0.5}Na_{0.5})NbO_3$ Ceramics", J. Am. Ceram. Soc., 1-6(2016)

BRIEF SUMMARY OF INVENTION

In order to realize a high performance and a downsizing of an apparatus in which the piezoelectric element including the piezoelectric composition is mounted, it is necessary to reduce the size of the piezoelectric element while maintaining the performances of the piezoelectric element. In this case, it is also necessary to reduce the size of the piezoelectric composition, however, the mechanical strength of the piezoelectric composition decreases as the size of the piezoelectric composition reduces. If the mechanical strength is lowered, defective products may be generated during processing the piezoelectric composition. Thus, the piezoelectric composition is required to have a preferable mechanical strength.

In addition, since the apparatus in which the piezoelectric element is mounted is used in various environments, the piezoelectric element is required to have a high reliability against severe environments. A condition of a high temperature and a high humidity is exemplified as the severe environment.

However, according to the alkali metal niobate based compound disclosed in the above Patent Document 1, the alkali metal elements volatilize during firing, voids, defects, etc. are likely to generate inside the piezoelectric composition after firing. And thus, there was a problem that the mechanical strength is low. However, the above Patent Document 1 did not evaluate its mechanical strength at all. Further, it is considered that such as moisture is likely to invade through voids, defects, etc. generated inside the piezoelectric composition disclosed in the above Patent Document 1 after firing. Thus, it is also considered that the reliability is low.

It is described that a low temperature sintering is possible for the alkali metal niobate based compound disclosed in Non-Patent Document 1, however, the piezoelectric properties such as the mechanical quality factor $Q_m$ are low. Moreover, the mechanical strength and the mechanical reliability were not evaluated at all.

The present invention has been made in view of such circumstances, and an object of the invention is to provide a piezoelectric composition compatible with a mechanical strength and a piezoelectric property, and having a high reliability and a piezoelectric element including the piezoelectric composition.

BRIEF SUMMARY OF INVENTION

In order to achieve the above object, an aspect of the invention is

[1] a piezoelectric composition including copper, germanium, and a complex oxide represented by a compositional formula $K_m NbO_3$ and having a perovskite structure, in which m in the compositional formula satisfies $0.970 \leq m \leq 0.999$, and with respect to 1 mol of the complex oxide, x mol % of copper in terms of a copper element and y mol % of germanium in terms of a germanium element are contained, wherein x satisfies 0.100≤x≤1.000 and y satisfies 0.000<y≤1.500.

[2] The piezoelectric composition according to [1], wherein m satisfies 0.991≤m≤0.999.

[3] A piezoelectric composition including copper, germanium and a complex oxide represented by a compositional formula $K_mNbO_3$ and having a perovskite structure, in which the piezoelectric composition includes crystal grains having a perovskite structure and a grain boundary, and germanium is distributed at the grain boundary.

[4] The piezoelectric composition according to [3], wherein the grain boundary distributes one or more elements selected from a group consisting of potassium, niobium, and copper.

[5] A piezoelectric element including the piezoelectric composition according to any one of [1] to [4].

In case when the piezoelectric composition according to the invention has the above properties, it is possible to provide a piezoelectric composition, that can satisfy both a mechanical strength and a piezoelectric property and has a high reliability, and a piezoelectric element including the piezoelectric composition.

Hereinafter, the invention will be described in detail based on specific embodiments in the following order.

1. Piezoelectric Element
  1.1 Piezoelectric Composition
2. Method of Producing Piezoelectric Element
3. Summary of the Embodiment
4. Modified Embodiments 1. Piezoelectric Element First, a piezoelectric element to which the piezoelectric composition according to the embodiment is applied will be described. The piezoelectric element is not particularly limited as long as it is an element to which the piezoelectric composition according to the embodiment can be applied. In the embodiment, a piezoelectric transformer, a thin film sensor, and a piezoelectric ultrasonic motor, etc. are exemplified.

Figure 1:
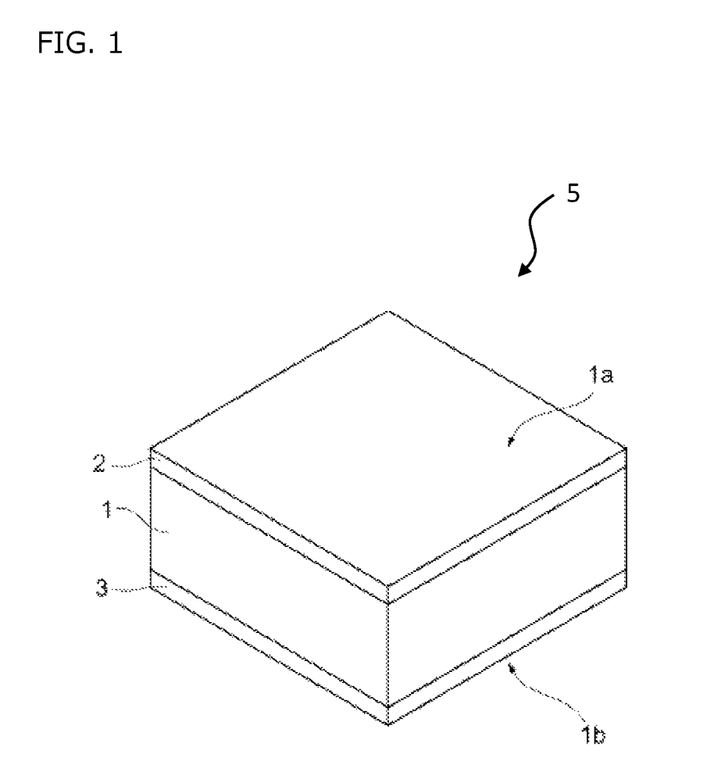
FIG. 1 is a schematic perspective view of an example of a piezoelectric element according to the embodiment.

The piezoelectric element 5 shown in FIG. 1 includes a plate-shaped piezoelectric part 1 and a pair of electrodes 2 and 3 formed on a pair of opposing surfaces 1a and 1b, which are both main surfaces of the piezoelectric part 1. The piezoelectric part 1 includes the piezoelectric composition according to the embodiment. Details of the piezoelectric composition will be described later. The conductive material contained in the electrodes 2, 3 is not particularly limited, and can be arbitrarily set according to desired properties, use, etc. Gold (Au), silver (Ag), palladium (Pd), etc. are exemplified in the embodiment.

Although the piezoelectric part 1 has a rectangular parallelepiped shape in FIG. 1, the shape of the piezoelectric part 1 is not particularly limited and can be arbitrarily set according to desired properties, use, etc. In addition, the size of the piezoelectric part 1 is not particularly limited, and can be arbitrarily set according to desired properties, use, etc.

The piezoelectric part 1 is poled in a predetermined direction. For example, in the piezoelectric element 5 shown in FIG. 1, it is polarized in the thickness direction of the piezoelectric part 1, namely, it is polarized in the direction in which the electrodes 2 and 3 are opposed. For instance, an external power supply (not shown) is electrically connected to the electrodes 2, 3, via wires or the like (not shown), and a predetermined voltage is applied to the piezoelectric part 1 via the electrodes 2, 3. When voltage is applied, an electrical energy is converted into a mechanical energy by the converse piezoelectric effect in the piezoelectric part 1, and the piezoelectric part 1 can vibrate in a predetermined direction.

1.1 Piezoelectric Composition

The piezoelectric composition according to the embodiment includes the complex oxide having a perovskite structure represented by a general formula $ABO_3$ as a main component. Further, the piezoelectric composition according to the embodiment contains copper (Cu) and germanium (Ge) in addition to the complex oxide. In the embodiment, the main component accounts for 90 mol % or more with respect to 100 mol % of the piezoelectric composition.

In the perovskite structure, an element having a large ion radius such as alkali metal elements, alkaline earth metal elements tend to occupy an A site of $ABO_3$ while an element having a small ion radius such as transition metal elements tend to occupy an B site of $ABO_3$. Then, the $BO_6$ oxygen octahedra including the B site element and oxygen constitute a three-dimensional network in which the apexes of the $BO_6$ oxygen octahedra are shared, and the perovskite structure is formed by filling the A site element in the interstitial site of the network.

In the embodiment, the general formula $ABO_3$ can be represented by a compositional formula $K_mNbO_3$. That is, the A site element is potassium (K) and the B site element is niobium (Nb).

"m" in the above compositional formula indicates a ratio of the total atom number of the A site element with respect to the one of the B site element, so-called an AB ratio. That is, it is a ratio of the number of K atoms to the number of Nb atoms. According to the embodiment, "m" satisfies 0.970≤m≤0.999.

That is, when the B site element (Nb) is present in excess of the A site element (K), a preferable mechanical strength can be obtained. Incidentally, when "m" is larger than the above range, the obtained piezoelectric composition exhibits a high deliquescence, the strength tends to be remarkably low and tends to be unable to withstand processing. On the other hand, when "m" is smaller than the above range, the density of the obtained piezoelectric composition tends to be low and the mechanical strength tends to decrease.

"m" is preferably 0.970 or more, and more preferably 0.991 or more. On the other hand, "m" is preferably 0.999 or less.

In the piezoelectric composition according to the embodiment, when a content of Cu in terms of Cu element with respect to 1 mol (100 mol %) of the above composite oxide is x mol %, "x" satisfies 0.100≤x≤1.000.

As long as Cu is contained within the above range, there are no particular restrictions on its existence form, and Cu may be dissolved in the grains of the crystal grains constituting the composite oxide or may be present in grain boundaries. It may form a compound with another element, when present in the grain boundary. However, it is preferable that a large number of crystal particles having a crystal phase including the above $K_mNbO_3$ exist, and it is not preferable that it exists as a secondary phase other than the above.

By the presence of Cu in grains and/or grain boundaries, the bonding strength between the crystal grains becomes strong, and the mechanical strength of the piezoelectric composition can be enhanced. Further, the content of Cu is related to the above-described "m". By setting the content of Cu and the range of "m" within the above range, Cu dissolve in the crystal grains or remains in the grain boundary, which makes it difficult to form a secondary phase containing Cu. As a result, the bonding force between the crystal grains can be further enhanced.

In addition, by including Cu, a mechanical quality factor $Q_m$ can be improved. However, when the content of Cu is too large, a leakage current may be generated at the time of poling processing with the piezoelectric composition may be generated and a sufficient poling may not be performed in some cases. In this case, the poling becomes insufficient, and the piezoelectric properties exerted by arranging the directions of the spontaneous polarization in a predetermined direction are conversely reduced. Therefore, in the embodiment, by including Cu within the above range and by setting the range of "m" within the above range, it is possible to suppress the secondary phase, which is the main cause of generating the leakage current. As a result, sufficient poling processing can be processed. Thus, an effect of improving $Q_m$ can be obtained and $Q_m$ can be improved.

"X" is preferably 0.200 or more, and more preferably 0.600 or more.

In the piezoelectric composition according to the embodiment, when a content of Ge in terms of Ge element with respect to 1 mol (100 mol %) of the above composite oxide is y mol %, "y" satisfies $0.000 \leq y \leq 1.500$.

When Ge is contained within the above range, the expression of deliquescence peculiar to the potassium niobate compound is suppressed, and a potassium niobate compound based piezoelectric composition exerts a high reliability even under an environment of a high temperature and a high humidity. However, if the content of Ge is too large, a secondary phase derived from Ge tends to be formed, and the mechanical strength of the piezoelectric composition tends to decrease.

"Y" is preferably 0.100 or more, and more preferably 1.000 or more.

In addition, the piezoelectric composition according to the embodiment includes crystal grains having a perovskite structure, that is, crystal grains including a complex oxide and a grain boundary.

In the embodiment, Ge is mainly distributed at the grain boundary. It is considered that the deliquescence of the piezoelectric composition can be suppressed by distributing Ge in the grain boundary. Therefore, it is preferable that the dissolved amount of Ge in the grains is small and Ge is not dissolved into grains with potassium niobate compound.

The present inventors presume that the deliquescence phenomenon of the potassium niobate compound is caused by the following. The potassium contained in the potassium niobate compound is hydrated with moisture in the air, resulting in that the reacted part becomes fragile and the bonding strength between the crystal grains weaken.

In the embodiment, since germanium is distributed at the grain boundary, it is easy to convert a form in which potassium is likely to be hydrated to a form in which potassium is hardly hydrated. And deterioration of the mechanical strength based on the deliquescence phenomenon can be suppressed.

The piezoelectric composition according to the embodiment may contain the other components besides the above described components. For example, at least one metal element of the transition metal elements (elements of Groups 3 to 11 in the long period periodic table) other than the above described Nb and Cu, the alkaline earth metal elements, the Group 12 elements in the long periodic table and the Group 13 elements in the long periodic table may be contained. This makes it possible to improve piezoelectric properties other than Qm, in particular, the electromechanical coupling coefficient (k).

In concrete, transition metal elements excluding rare earth elements exemplifies chromium (Cr), manganese (Mn), iron (Fe), cobalt (Co), nickel (Ni), tungsten (W), and molybdenum (Mo). As the rare earth element, yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm) and ytterbium (Yb) are exemplified.

As the alkaline earth metal element, magnesium (Mg), and strontium (Sr) are exemplified. As the group 12 element, zinc (Zn) is exemplified. As the group 13 metal element, aluminum (Al), gallium (Ga), and indium (In) are exemplified.

Although the piezoelectric composition according to the embodiment may contain lead (Pb) as an impurity, the content thereof is preferably 1 mass % or less in 100 mass % of the piezoelectric composition, more preferably, Pb is not included. From the viewpoint of a low pollution, an environment resistance and an ecology, it is possible to minimize a volatilization of Pb at the time of firing, and further, it is possible to minimize the release of Pb into the environment after an electronic apparatus mounting the piezoelectric element including the piezoelectric composition of the embodiment is being distributed to the market and being disposed.

The average crystal grain size of the crystal grains including the piezoelectric composition according to the embodiment may be controlled from the viewpoint of exhibiting piezoelectric properties and mechanical strength. In the embodiment, it is preferable that the average crystal grain size is, for example, 0.5 μm to 20 μm.

2. Producing Method of Piezoelectric Element

Next, an example of a producing method of the piezoelectric element will be described below.

First, a starting material for the piezoelectric composition is prepared. As a starting material for the composite oxide, a compound containing K or a compound containing Nb can be used. Examples of compounds containing K include carbonates and hydrogen carbonate compounds. As the compound containing Nb, for example, oxides are exemplified.

A starting material for copper may be copper alone or a copper containing compound. In the embodiment, it is preferably an oxide containing copper. The starting material for germanium, same as the copper, may be germanium alone or a germanium containing compound. In the embodiment, it is preferably an oxide containing germanium.

After weighing the starting materials of the prepared composite oxide to a predetermined ratio, mixing is carried out for 5 to 20 hours using such as a ball mill. As a method of mixing, a wet mixing or a dry mixing may be used. In the case of wet mixing, the mixed powder is dried. Subsequently, the mixed powder or a green compact obtained by compacting the mixed powder is subjected to a heat treatment (calcination) in the air at 750 to 1050° C. for 1 to 20 hours to obtain a calcined powder of the complex oxide.

The composite oxide constituting the obtained calcined powder has a perovskite structure represented by the general formula $KNbO_3$.

When the obtained calcined powder is aggregated, it is preferable to grind the calcined powder for a predetermined time by using a ball mill to obtain a pulverized powder. The starting material of copper and the starting material of germanium weighed at a predetermined ratio are added to the calcined powder or the pulverized powder, and mixed for 5 to 20 hours, for example, using a ball mill, and the mixed powder of the piezoelectric composition is obtained. The wet mixing or the dry mixing may be used as a method of mixing. In the case of wet mixing, the mixed powder is dried to obtain a mixed powder of the piezoelectric composition.

A method of compacting the mixed powder of the piezoelectric composition is not particularly limited, and it may be suitably selected according to a desired shape, size, etc. In the case of performing pressing, a predetermined binder and, if necessary, additives are added to the mixed powder of the piezoelectric composition, and the mixture is formed into a predetermined shape to obtain a green compact. Further, the green compact may be obtained by using a granulated powder obtained by adding such as a predetermined binder to the mixed powder of the piezoelectric composition and granulating thereof. If necessary, the obtained green compact may be subjected to further pressure treatment by such as CIP.

A binder removal treatment is applied to the obtained green compact. As the binder removal condition, the holding temperature is preferably 400° C. to 800° C., and the temperature holding time is preferably 2 hours to 8 hours.

Subsequently, the green compact after the binder removal treatment is fired. As the firing conditions, the holding temperature is preferably 950° C. to 1060° C., the temperature holding time is preferably 2 hours to 4 hours, the temperature rising and cooling rate is preferably about 50° C./hour to 300° C./hour, the atmosphere is preferably an oxygen-containing atmosphere.

The obtained piezoelectric composition as a sintered body is polished if necessary, an electrode paste is applied and baked to form an electrode. The method for forming the electrodes is not particularly limited, and electrodes may be formed by a vapor deposition, a sputtering, etc.

A DC electric field of 2 kV/mm to 5 kV/mm is applied for 5 minutes to 1 hour in an oil at a predetermined temperature to pole the sintered body on which the electrode is formed. After the poling processing is performed, a piezoelectric composition in which the spontaneous polarization is aligned in a predetermined direction is obtained.

The piezoelectric composition after the poling processing is worked to a predetermined size as necessary to form a plate-shaped piezoelectric part 1. Next, the electrodes 2 and 3 are formed on the piezoelectric part 1 by such as a vapor deposition, whereby the piezoelectric element shown in FIG. 1 is obtained.

3. Summary of the Embodiment

In the embodiment, potassium niobate having the perovskite structure is employed as a complex oxide contained as a main component in the piezoelectric composition. Copper (Cu) and germanium (Ge) are further added to the piezoelectric composition within the above range.

Since Cu contained in the above range is not excessively contained with respect to the composite oxide, the secondary phases which differ from crystal grains constituting the composite oxide are difficult to be formed. Namely, Cu is solid-solved in the crystal grains constituting the composite oxide or present in the grain boundary formed between crystal grains. The existence of Cu in such form strengthens the bonding force between the crystal grains, and as a result, the mechanical strength as the piezoelectric composition improves.

The fired piezoelectric composition is sometimes processed, for example, during poling processing and producing a piezoelectric element. If the piezoelectric composition does not have a preferable mechanical strength, problems such as chipping and cracking due to insufficient strength of the piezoelectric composition occur during processing, causing defective products. When such defective products are processed, the yield decreases and a high productivity cannot be realized. Since mechanical energy and electrical energy are repeatedly applied to the piezoelectric composition, it is necessary to have a strength capable of withstanding thereof. Since the piezoelectric composition according to the embodiment has a preferable mechanical strength, it has a preferable processability, and it can improve the yield and improve the production efficiency of the piezoelectric element. Furthermore, the piezoelectric composition according to the embodiment has a sufficient strength to withstand repeatedly applied mechanical energy and electrical energy.

Although Cu has an effect of improving the mechanical quality factor $Q_m$, if the content of Cu increases, the leakage current during the poling processing of the piezoelectric composition increases, the poling processing becomes insufficient, conversely, there is a problem that $Q_m$ decreases. Therefore, in the embodiment, by controlling the "m" of the composite oxide together with the content of Cu, it is possible to suppress the generation of secondary phases, to enlarge the range of the content of Cu capable of sufficient poling processing, and to realize a high $Q_m$.

Ge contained in the above range maintains the mechanical strength and piezoelectric properties of the piezoelectric composition and a reliability of the same under an environment of a high temperature and a high humidity can be enhanced.

In addition, since Ge is distributed at the grain boundary, potassium which is likely to be hydrated easily converts to a form that is hardly hydrated. As a result, deterioration of the piezoelectric composition due to the deliquescence phenomenon is suppressed, and the reliability under a high temperature and a high humidity environment can be enhanced.

4. Modified Embodiments

In the embodiment described above, the piezoelectric element in which the piezoelectric part is a single layer has been described, but a piezoelectric element having a structure in which piezoelectric parts are laminated may be used. Further, a piezoelectric element having a combination of these may be used.

Figure 2:
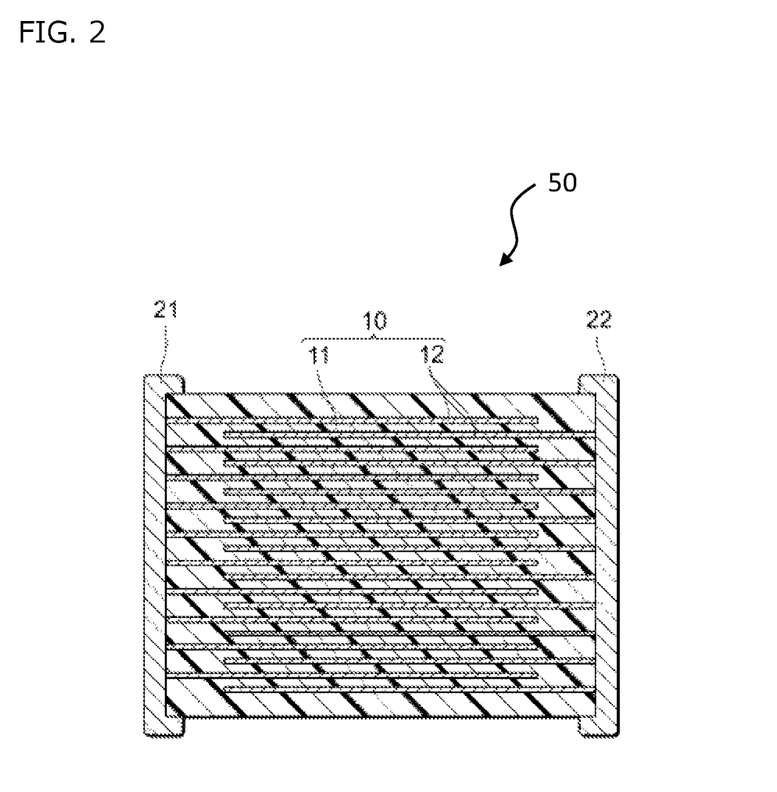
FIG. 2 is a schematic cross sectional view of another example of the piezoelectric element according to the embodiment.

As the piezoelectric element having a structure in which piezoelectric parts are laminated, for example, the piezoelectric element 50 shown in FIG. 2 is exemplified. This piezoelectric element 50 includes a laminate 10 in which multiple piezoelectric layers 11 made of the piezoelectric composition according to the embodiment and multiple internal electrodes 12 are alternately laminated. A pair of terminal electrodes 21 and 22 are formed on both end parts of the laminate 10 so as to be electrically connected to the internal electrode layers 12 alternately arranged inside the laminate 10.

The thickness (an interlayer thickness) per one layer of the piezoelectric layers 11 is not particularly limited, and can be set arbitrarily according to desired properties, use, etc. Usually, the interlayer thickness is preferably about 1 μm to 100 μm. The number of layers of the piezoelectric layer 11 is not particularly limited, and can be arbitrarily set according to desired properties, use, etc.

As a method of producing the piezoelectric element 50 shown in FIG. 2, a known method may be used. For example, a green chip to be the laminate 10 shown in FIG. 2 is prepared and fired to obtain a laminate 10. Then, terminal electrodes are printed or transferred to the laminate 10 and fired thereof. A general printing method and a sheet method each using paste are exemplified as methods for producing the green chip. In the printing method and the sheet method, a green chip is formed by using a paste prepared by mixing raw material powders of the above described piezoelectric composition and a vehicle in which a binder is dissolved in a solvent and forming a paint.

Although the embodiment of the invention has been described above, the invention is not limited to the above embodiments and modifications may be made in various aspects within a scope of the invention.

EXAMPLE

Hereinafter, the invention will be described in more detail using examples and comparative examples. However, the invention is not limited to the following examples.

First, powder of potassium hydrogen carbonate ($KHCO_3$) and powder of niobium oxide ($Nb_2O_5$) were prepared as starting materials for the composite oxide ($K_mNbO_3$) which is a main component of the piezoelectric composition. Powder of copper oxide (CuO) and powder of germanium oxide ($GeO_2$) were also prepared as starting materials for copper (Cu) and germanium (Ge) contained in the piezoelectric composition.

The prepared starting materials were weighed so that the piezoelectric composition (sintered body) after firing had the composition shown in Table 1. Each weighed powder of $KHCO_3$ and $Nb_2O_5$ was mixed by a ball mill for 16 hours, subsequently dried at 120° C., and obtained a mixed powder. The obtained mixed powder was pressed to compact the mixed powder, calcined at 1000° C. for 4 hours, and obtained a calcined body of the complex oxide. Subsequently, the calcined body was pulverized by a ball mill for 16 hours and obtained a pulverized powder.

Each weighed powder of CuO and $GeO_2$ was added to the obtained pulverized powder, mixed by a ball mill for 16 hours, subsequently dried at 120° C., and obtained a raw material powder of the piezoelectric composition. PVA as a binder was added to the obtained raw material powder of the piezoelectric composition, and granulated thereof by a known method. Next, the obtained granulated powder was pressed by a pressing machine under a load of 196 MPa and obtained a plate-shaped green compact.

The plate-shaped green compact thus obtained was subjected to a binder removal treatment at 550° C. for 2 hours. The green compact after the binder removal treatment was fired under air at 1050° C. for 2 hours and obtained a piezoelectric composition (a sintered body).

The obtained sintered body was polished to obtain a parallel plate shape having a thickness of 1.0 mm, silver paste was printed on both sides of the parallel plate shaped sintered body, baked thereof at 800° C. and provided facing electrodes of silver. The sintered body was cut into a length of 12 mm and a width of 3 mm by a dicing saw according to EM-4501 M of JEITA (Japan Electronics and Information Technology Industries Association) standard and obtained a sample before poling. Finally, a DC electric field of 3 kV/mm was applied to the sample before poling in silicone oil at 150° C. for 5 minutes to polarize the piezoelectric composition, and piezoelectric composition samples (Examples 1 to 18 and Comparative Examples 1 to 8) were obtained.

The mechanical strength and the mechanical quality factor $Q_m$ were measured in the following manner with respect to the obtained sample.

The piezoelectric composition (the sintered body) was polished and cut into a length of 7.2 mm, a width of 2.5 mm, and a thickness of 0.32 mm by a double-sided lapping machine and a dicing saw, and a sample for measuring mechanical strength was obtained. For each sample, 20 samples of maximum loads (N) when the samples for mechanical strength measurement were broken by a three point bending with an inter-fulcrum distance of 5 mm were measured with 5543 made by INSTRON Co., Ltd., and the average value thereof was taken as the mechanical strength. In this example, in consideration of practical processability, a sample having the mechanical strength of 70 MPa or more was determined preferable. The results are shown in Table 1.

$Q_m$ was measured with 4194 A IMPEDANCE/GAIN-PHASE ANALYZER made by HEWLETT PACKARD. In this example, it was judged that the sample having Qm of 200 or more was determined preferable. The results are shown in Table 1.

In the column of the mechanical quality factor $Q_m$ in Table 1, "-" represents that the piezoelectric composition could not be sufficiently poled or the dielectric breakdown occurred during the poling processing, thus, the piezoelectric properties was not obtained indicating that $Q_m$ could not be measured.

Further, the test was conducted to the samples after measuring the mechanical strength and $Q_m$ under a high temperature and a high humidity environment, and then the above mechanical strength and $Q_m$ were measured and evaluated the reliability of the sample. Specifically, after measuring the mechanical strength and $Q_m$, the sample was placed in a thermostatic chamber kept at room temperature. In the thermostatic chamber, the target temperature was 85° C. (an error within plus or minus 2° C. was accepted) and the target relative humidity was 85% RH (an error within plus or minus 2% was accepted). After maintaining this condition for 1,000 hours, the sample was removed from the thermostatic chamber and the mechanical strength and $Q_m$ were measured in the same manner as above. From the measured values, the deterioration rates of the mechanical strength and of $Q_m$ were calculated by the following equation. In this example, a sample having a mechanical strength of 70 MPa or more and deterioration rates of 10% or less in both is referred to as "A" in Table 1. A sample having a mechanical strength of less than 70 MPa and deterioration rates of 10% or less in both is referred to as "B" in Table 1. A sample having a mechanical strength of less than 70 MPa and at least one of the deterioration rates of more than 10% or at least one of the deterioration rates is not measurable is referred to as "C" in Table 1. The results are shown in Table 1.

> Deterioration rate (%) of the mechanical strength= (the mechanical strength before the high temperature and the high humidity test−the mechanical strength after the high temperature and the humidity test)×100/the mechanical strength before the high temperature and the high humidity test.
>
> Deterioration rate (%) of $Q_m$=($Q_m$ before the high temperature and the high humidity test−$Q_m$ after the high temperature and the high humidity test)×100/$Q_m$ before the high temperature and the high humidity test Further, STEM-EDS analysis was performed to the cross section of the sample. It was confirmed that, except for the samples of Comparative Examples 5 and 7, Ge was present in a grain boundary between two grains or in a grain boundary triple point.

Figure 3:
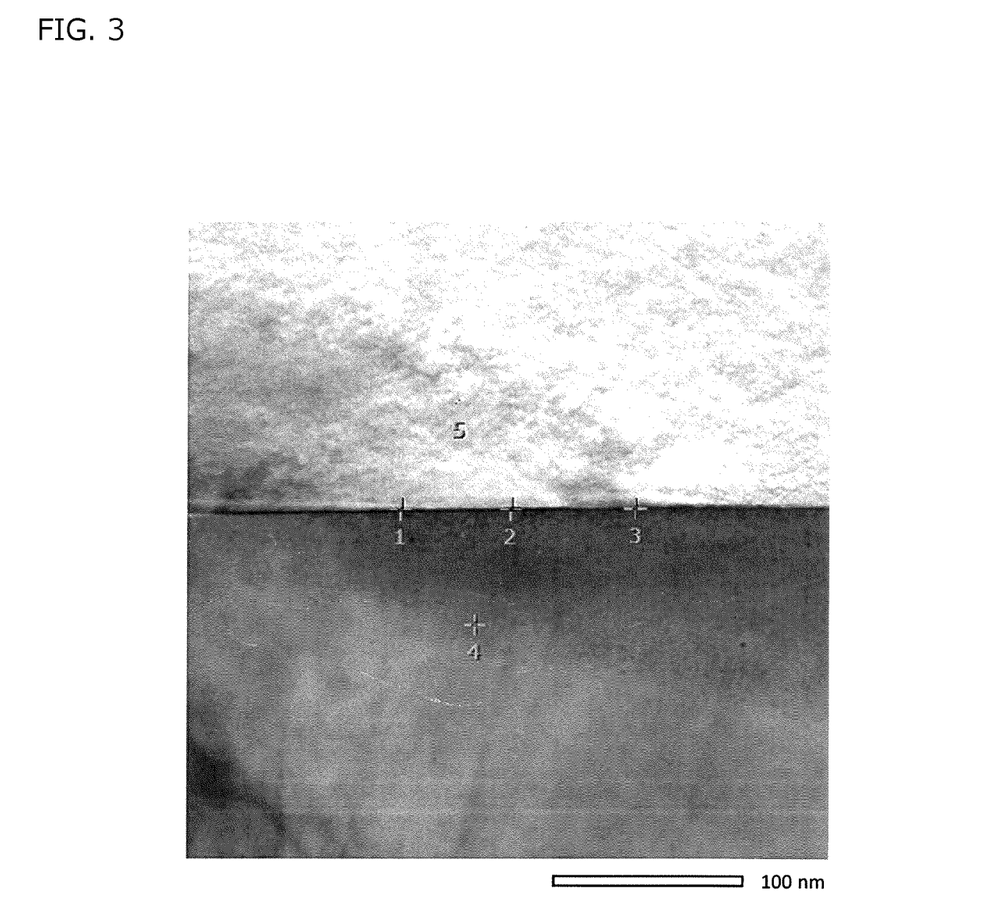
FIG. 3 is a STEM image of a sample cross section of a piezoelectric composition according to an example of the invention.
Figure 4:
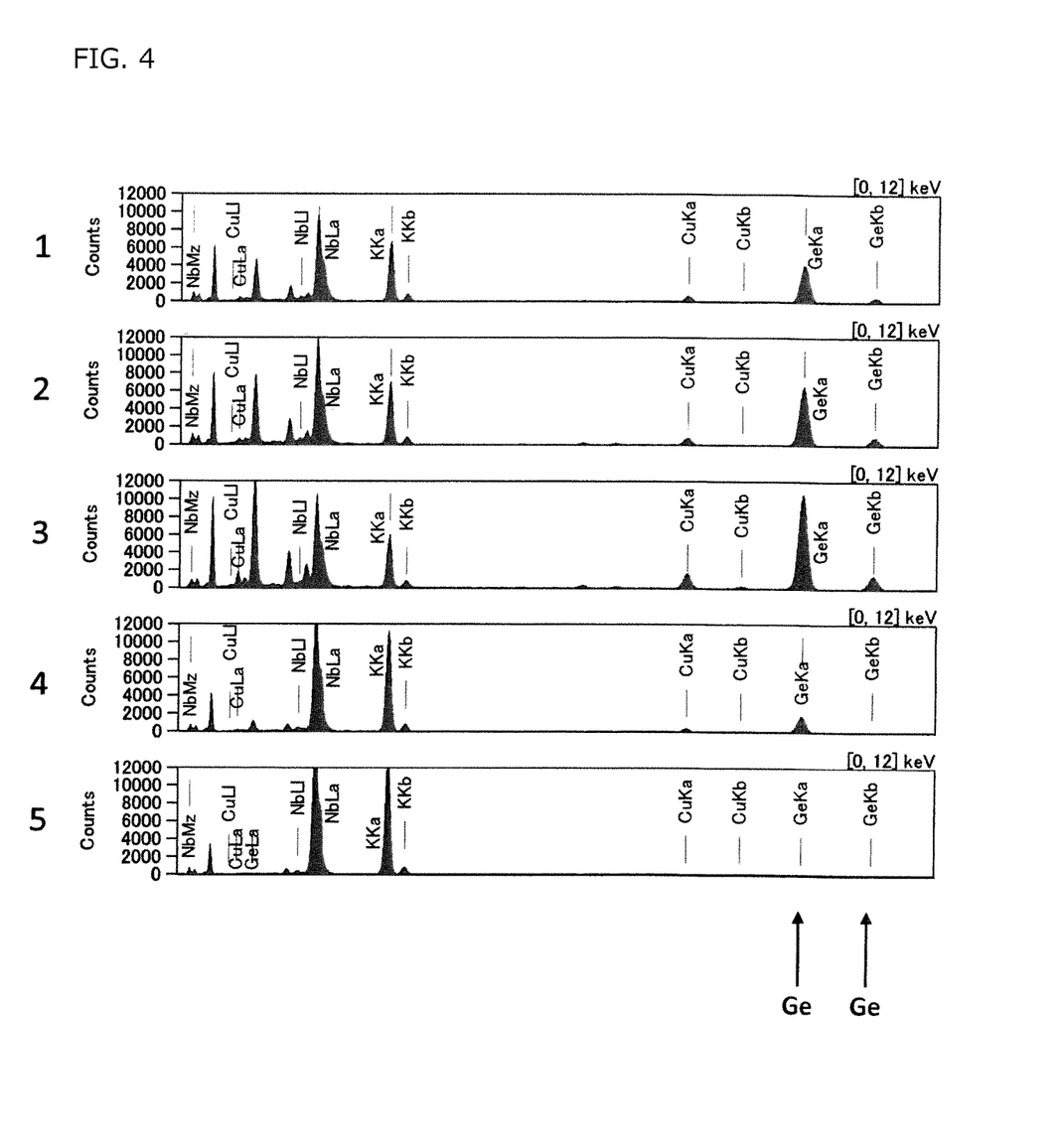
FIG. 4 is a view showing EDS point analysis results at points 1 to 5 shown in FIG. 3.

FIG. 3 shows a STEM image of the cross section of the sample as in Example 7. The results of EDS point analysis in the STEM image shown in FIG. 3 are shown in FIG. 4. EDS point analysis was carried out at points 1 to 5 shown in FIG. 3. Points 1 to 3 are analysis points on two grain boundaries, and points 4 and 5 are analysis points on crystal grains.

From Table 1, when "m" is within the above range in the composite oxide represented by the compositional formula $K_mNbO_3$ and the content of copper and germanium with respect to the composite oxide is within the above range, it was confirmed that a preferable mechanical strength can be obtained, $Q_m$ improves, and a high reliability can be obtained. In particular, it was confirmed that the deterioration rate increases in Comparative Examples 5 and 7 in which germanium was not contained.

From FIGS. 3 and 4, it was confirmed that germanium is mainly contained in the grain boundary, and almost not contained in the crystal particles.

Since the piezoelectric composition according to the invention can satisfy both a good mechanical strength and a good $Q_m$ and has a high reliability, it can be suitably used for piezoelectric elements in various fields.

DESCRIPTION OF REFERENCE NUMERAL

5 . . . Piezoelectric element
1 . . . Piezoelectric part
2, 3 . . . Electrodes
50 . . . Piezoelectric element
10 . . . Multilayer body
11 . . . Piezoelectric layer
12 . . . Internal electrode layer
21, 22 . . . terminal electrodes

What is claimed is:
1. A piezoelectric composition comprising copper, germanium and a complex oxide represented by a compositional formula $K_mNbO_3$ and having a perovskite structure, in which m in the compositional formula satisfies 0.970≤m≤0.999, and

TABLE 1

| | | Component | | Properties | | | | |
| | | | | | Mechanical | Deterioration rates | | |
| | | Cu | Ge | Mechanical | quality | (%) | | |
| Sample No. | $K_mNbO_3$ m | X (mol %) | Y (mol %) | strength (MPa) | factor Qm | Mechanical strength | Qm | Evaluation |
|---|---|---|---|---|---|---|---|---|
| Ex. 1 | 0.999 | 0.1 | 0.8 | 75 | 350 | 1 | 4 | A |
| Ex. 2 | 0.998 | 0.2 | 0.8 | 115 | 680 | 1 | 4 | A |
| Ex. 3 | 0.996 | 0.4 | 0.8 | 114 | 1200 | 1 | 3 | A |
| Ex. 4 | 0.995 | 0.6 | 0.8 | 116 | 1650 | 1 | 3 | A |
| Ex. 5 | 0.994 | 0.8 | 0.8 | 116 | 1780 | 1 | 2 | A |
| Ex. 6 | 0.994 | 0.9 | 0.8 | 114 | 1850 | 1 | 2 | A |
| Ex. 7 | 0.994 | 1.0 | 0.8 | 115 | 1930 | 1 | 1 | A |
| Ex. 8 | 0.991 | 1.0 | 0.8 | 116 | 860 | 1 | 3 | A |
| Ex. 9 | 0.983 | 1.0 | 0.8 | 118 | 410 | 1 | 3 | A |
| Ex. 10 | 0.983 | 0.9 | 0.8 | 117 | 380 | 2 | 6 | A |
| Ex. 11 | 0.970 | 1.0 | 0.8 | 78 | 220 | 3 | 7 | A |
| Ex. 12 | 0.970 | 0.9 | 0.8 | 76 | 210 | 4 | 8 | A |
| Ex. 13 | 0.994 | 1.0 | 0.1 | 112 | 1900 | 7 | 9 | A |
| Ex. 14 | 0.994 | 1.0 | 0.2 | 113 | 1910 | 6 | 8 | A |
| Ex. 15 | 0.994 | 1.0 | 0.3 | 113 | 1910 | 5 | 7 | A |
| Ex. 16 | 0.994 | 1.0 | 0.5 | 114 | 1920 | 4 | 6 | A |
| Ex. 17 | 0.994 | 1.0 | 1.0 | 113 | 1890 | 1 | 2 | A |
| Ex. 18 | 0.994 | 1.0 | 1.5 | 112 | 1880 | 1 | 2 | A |
| Comp. Ex. 1 | 0.994 | 0.0 | 0.8 | 65 | 260 | 1 | 2 | B |
| Comp. Ex. 2 | 0.994 | 1.1 | 0.8 | 60 | — | 1 | — | C |
| Comp. Ex. 3 | 1.001 | 0.1 | 0.8 | 67 | 280 | 3 | 3 | B |
| Comp. Ex. 4 | 0.969 | 1.0 | 0.8 | 60 | — | 1 | — | C |
| Comp. Ex. 5 | 1.001 | 0.1 | 0.0 | 67 | 280 | 12 | 18 | C |
| Comp. Ex. 6 | 1.001 | 0.1 | 1.6 | 45 | 275 | 1 | 2 | B |
| Comp. Ex. 7 | 1.001 | 1.0 | 0.0 | 68 | 265 | 8 | 16 | C |
| Comp. Ex. 8 | 1.001 | 1.0 | 1.6 | 43 | 135 | 1 | 2 | B | with respect to 1 mol of the complex oxide, x mol % of copper in terms of a copper element and y mol % of germanium in terms of a germanium element are contained, wherein x satisfies $0.100 \leq x \leq 1.000$ and y satisfies $0.000 < y \leq 1.500$.

2. The piezoelectric composition according to claim 1, wherein m satisfies $0.991 \leq m \leq 0.999$.

3. The piezoelectric composition according to claim 1, wherein x is $0.200 \leq x \leq 1.000$.

4. The piezoelectric composition according to claim 1, wherein x is $0.600 \leq x \leq 1.000$.

5. The piezoelectric composition according to claim 1, wherein y is $0.100 < y \leq 1.500$.

6. The piezoelectric composition according to claim 1, wherein y is $1.000 < y \leq 1.500$.

7. A piezoelectric composition comprising copper, germanium and a complex oxide represented by a compositional formula $K_m NbO_3$ and having a perovskite structure, in which m in the compositional formula satisfies $0.970 \leq m \leq 0.999$,
the piezoelectric composition comprises crystal grains having a perovskite structure and a grain boundary, and germanium is distributed at the grain boundary.

8. The piezoelectric composition according to claim 7, wherein the grain boundary distributes one or more elements selected from a group consisting of potassium, niobium and copper.

9. A piezoelectric element including the piezoelectric composition according to claim 1.

10. A piezoelectric element including the piezoelectric composition according to claim 7.

* * * * *